(12) United States Patent
Yamashita et al.

(10) Patent No.: US 9,530,722 B2
(45) Date of Patent: Dec. 27, 2016

(54) SEMICONDUCTOR DEVICE AND PRODUCTION METHOD FOR SAME

(71) Applicant: Hitachi Automotive Systems, Ltd., Hitachinaka-shi, Ibaraki (JP)

(72) Inventors: Shiro Yamashita, Tokyo (JP); Hideto Yoshinari, Hitachinaka (JP); Takashi Kume, Hitachinaka (JP); Shinichi Fujino, Hitachinaka (JP); Eiichi Ide, Tokyo (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 0 days.

(21) Appl. No.: 14/425,941

(22) PCT Filed: Sep. 4, 2013

(86) PCT No.: PCT/JP2013/073791
§ 371 (c)(1),
(2) Date: Mar. 4, 2015

(87) PCT Pub. No.: WO2014/038587
PCT Pub. Date: Mar. 13, 2014

(65) Prior Publication Data
US 2015/0294927 A1    Oct. 15, 2015

(30) Foreign Application Priority Data
Sep. 7, 2012   (JP) ................. 2012-197347

(51) Int. Cl.
*H01L 23/495*     (2006.01)
*H01L 23/28*      (2006.01)
(Continued)

(52) U.S. Cl.
CPC ......... *H01L 23/49537* (2013.01); *H01L 21/56* (2013.01); *H01L 23/28* (2013.01);
(Continued)

(58) Field of Classification Search
CPC .............. H01L 23/49537; H01L 23/49568; H01L 23/49524; H01L 23/49513; H01L 23/4334; H01L 23/49575; H01L 23/49562; H01L 23/28; H01L 21/56; H01L 24/33; H01L 24/00; H01L 2224/40137; H01L 2924/181; H01L 2924/15747

See application file for complete search history.

(56) References Cited

U.S. PATENT DOCUMENTS

2001/0033477 A1   10/2001   Inoue et al.
2004/0017311 A1    1/2004   Thomas et al.
(Continued)

FOREIGN PATENT DOCUMENTS

JP    10-107195 A    4/1998
JP    11-163045 A    6/1999
(Continued)

OTHER PUBLICATIONS

International Search Report (PCT/ISA/210) dated Nov. 19, 2013, with English translation (four (4) pages).
(Continued)

*Primary Examiner* — Dale E Page
*Assistant Examiner* — Wasiul Haider
(74) *Attorney, Agent, or Firm* — Crowell & Moring LLP

(57) ABSTRACT

The present invention relates to a power module obtained by connecting the opposite sides of a chip with solder, and prevents the side surfaces of a base portion from becoming wet with solder, which would otherwise cause connection failures of the solder or chip displacement, and also prevents peeling of molding resin, which would otherwise break the chip or shorten the life of the solder. The base portion is integrally formed with one of lead frames, and the side surfaces of the base portion and the surface of the main body (Continued)

of the lead frame are roughened so as to have reduced solder wettability. Meanwhile, the solder connection surface of the base portion is not roughened so as to ensure the solder wettability. Accordingly, it is possible to reduce failures that may occur during solder connection and obtain a highly reliable power module (FIG. 5).

3 Claims, 5 Drawing Sheets

(51) Int. Cl.
    *H01L 23/433*    (2006.01)
    *H01L 23/00*    (2006.01)
    *H01L 21/56*    (2006.01)

(52) U.S. Cl.
    CPC .... *H01L 23/4334* (2013.01); *H01L 23/49513* (2013.01); *H01L 23/49524* (2013.01); *H01L 23/49562* (2013.01); *H01L 23/49568* (2013.01); *H01L 23/49575* (2013.01); *H01L 24/00* (2013.01); *H01L 24/33* (2013.01); *H01L 2224/40137* (2013.01); *H01L 2924/15747* (2013.01); *H01L 2924/181* (2013.01)

(56) References Cited

U.S. PATENT DOCUMENTS

2005/0167802 A1    8/2005   Hirano et al.
2009/0207580 A1    8/2009   Oshika et al.
2012/0119343 A1*   5/2012   Bayan ................ H01L 21/4842
                                                                        257/676
2013/0341780 A1*  12/2013   Scharf .................... H01L 24/24
                                                                         257/677

FOREIGN PATENT DOCUMENTS

| JP | 2000-100854 A | 4/2000 |
| JP | 2001-352023 A | 12/2001 |
| JP | 2002-110893 A | 4/2002 |
| JP | 2002-329828 A | 11/2002 |
| JP | 2004-303854 A | 10/2004 |
| JP | 2005-244166 A | 9/2005 |
| JP | 2006-179655 A | 7/2006 |
| JP | 2006-261569 A | 9/2006 |
| JP | 2011-198804 A | 10/2011 |
| JP | 2011-216564 A | 10/2011 |

OTHER PUBLICATIONS

Japanese-language Written Opinion (PCT/ISA/237) dated Nov. 19, 2013 (three (3) pages).

Japanese-language Office Action issued in counterpart Japanese Application No. 2014-534387 dated Mar. 8, 2016 (three (3) pages).

\* cited by examiner

Fig. 7

| Whether or Not Lead Frame is Roughened | Not Roughened | Partially Roughened |
|---|---|---|
| Side Surfaces of Base Portion Being Wet | 18/20 | 0/20 |
| Chip Displacement | 17/20 | 0/20 |
| Peeling of Molding Resin | 20/20 | 0/20 |

Fig. 8

| Whether or Not Lead Frame is Roughened | Not Roughened | Partially Roughened |
|---|---|---|
| Side Surfaces of Base Portion Being Wet | 16/20 | 0/20 |
| Chip Displacement | 19/20 | 0/20 |
| Peeling of Molding Resin | 20/20 | 0/20 |

SEMICONDUCTOR DEVICE AND PRODUCTION METHOD FOR SAME

TECHNICAL FIELD

The present invention relates to a semiconductor device and a production method for the same. For example, the present invention relates to a semiconductor power module obtained by connecting semiconductor components to lead terminals with solder.

BACKGROUND ART

Conventionally, in a power module that performs power conversion and control, electrical connection and heat dissipation to a substrate have been realized by connecting one side of a chip onto the substrate with solder and connecting the other side of the chip to the substrate via wire bonding.

However, in response to a growing demand for size reduction of power modules as well as an increase in the heat dissipation amount, a method for connecting both the front and rear sides of a chip with solder and cooling the chip from the opposite sides thereof has been adopted. FIG. 1 shows an example of such module that adopts a structure in which a chip 1 is cooled from the opposite sides thereof using lead frames 3 and fins 5.

Such a heat dissipation method is also adopted in Patent Literature 1 to 3. Such a double-side cooled power module is formed by sealing the components with molding resin after solder connection and then providing cooling portions on the outer side of the components.

CITATION LIST

Patent Literature

Patent Literature 1: JP 2001-352023 A.
Patent Literature 2: JP 2005-244166 A
Patent Literature 3: JP 2002-110893 A

SUMMARY OF INVENTION

Technical Problem

When a power module such as the one described above is created, a chip is connected onto lead frames, which are formed of materials with high thermal conductivity, such as Cu, with solder in response to a demand for higher heat dissipation properties. At this time, if flat lead frames are connected to the opposite sides of the chip, it is concerned that solder on one side may come into contact with solder on the other side, which can generate a short. FIG. 2 shows an example in which a short is generated due to solder.

As a measure to avoid such a problem, Patent Literature 3 describes providing a structure in which a base portion and a spacer are provided as separate components on a solder connection portion of a lead frame 3, and the components are then connected to a chip electrode with solder (see FIG. 3). Accordingly, it is possible to prevent mutual proximity of the solders 2 on the opposite sides of the chip 1, and thus prevent a short.

However, when the base portion 3a is provided as a separate component on the lead frame 3 (i.e., when the lead frame 3 and the base portion 3a are bonded together with the solder 2), the solder wettability of the base portion 3a is important. If the wettability of the solder connection surface of the base portion 3a is equal to the wettability of the side surfaces of the base portion and the periphery thereof, the side surfaces of the base portion 3a will become wet with the solder 2 during solder connection. FIG. 4 shows a view in which a side surface of the base portion becomes wet with the solder 2. When such wetting is generated, there will be a shortage of the solder 2 at the connection portion between the lead frame 3 (i.e., base portion 3a) and the chip 1. Thus, an unconnected portion is generated. Further, as the solder 2 that wets the side surface(s) of the base portion pulls the chip 1 due to its surface tension, displacement of the chip 1 occurs. Due to such failures, the assembling properties, reliability, and performance in the subsequent stage will be lost. Thus, generation of such failures should be avoided.

Meanwhile, the aforementioned power module adopts a structure in which, after the chip 1 is connected to the lead frames 3 with solder, the components are sealed with molding resin. Such molding resin should surely cause the lead frames 3 and the chip 1 to tightly adhere together. Due to the adhesion, it is possible to ensure the reliability of the chip 1 as well as prolong the life of the solder connection portion.

Thus, the molding resin is required to have a high degree of adhesion. If the degree of adhesion is low and the lead frames thus peel off the molding resin, there is a possibility that the peeling may develop, which can eventually break the chip. It is also concerned that the crack developing speed at the solder connection portion may increase, which can shorten the fatigue life.

Neither Patent Literature 1 nor 2 discloses an invention to solve such problems. Meanwhile, Patent Literature 3 describes providing a block (i.e., base portion 3a), which serves as a spacer, between the lead frame 3 and the chip 1 with the solder 2 interposed therebetween (see FIG. 3). In addition, oxidized surfaces are formed on the side surfaces of the block (i.e., base portion 3a) to prevent the side surfaces from becoming wet with the solder 2 as well as increase the degree of adhesion to molding resin. Further, Ni plating is applied to the lead frame 3 around the spacer (i.e., base portion 3a) to increase the degree of adhesion to the molding resin. However, in Patent Literature 3, there is also a disadvantage in that as the spacer (i.e., base portion 3a) is connected to the lead frame 3 with the solder 2, the number of solder connection portions is increased, which increases the level of difficulty of the process. Further, as the two different processes: formation of oxidized surfaces on the side surfaces of the spacer (i.e., base portion 3a) and Ni plating on the periphery thereof are applied, it is expected that the production process of the lead frame 3 is complex and the cost is high.

The present invention has been made in view of the foregoing circumstances, and provides a highly reliable semiconductor device by preventing the side surfaces of a base portion from becoming wet with solder, which would otherwise cause connection failures of the solder or chip displacement, and preventing peeling of molding resin, which would otherwise break the chip or shorten the life of the solder.

Solution to Problem

In order to achieve the above object, the semiconductor device in accordance with the present invention includes a semiconductor element, a first lead frame connected to a main surface of the semiconductor element with solder, and a second lead frame connected to an opposite surface of the semiconductor element with solder. Herein, a space between the first lead frame and the second lead frame is filled with molding resin. In addition, the second lead frame has a base portion, the base portion being integrally formed with the second lead frame and having a connection surface serving as a portion to be connected to the semiconductor element. Further, the surface roughness of a portion, which is connected to the molding resin, of the second lead frame is higher than the surface roughness of a surface (i.e., connection surface), which comes into contact with the solder for connection to the semiconductor element, of the base portion.

The portion, which is connected to the molding resin, of the second lead frame is subjected to a roughening treatment and thus has a rough surface. In addition, the roughness of the portion, which is connected to the molding resin, of the second lead frame may be about the same as the roughness of a portion other than the surface, which comes into contact with the solder, of the base portion.

Advantageous Effects of Invention

According to the present invention, it is possible to provide a highly reliable semiconductor device by preventing the side surfaces of a base portion from becoming wet with solder, which would otherwise cause connection failures of the solder or chip displacement, and preventing peeling of molding resin, which would otherwise break the chip or shorten the life of the solder.

Further features related to the present invention will become apparent from the description of the specification and the accompanying drawings. In addition, embodiments of the present invention can be implemented by elements, a combination of a variety of elements, the following detailed description, and the appended claims.

BRIEF DESCRIPTION OF DRAWINGS

FIG. 7 is a table showing the results of the number of failed samples in Example 1.

FIG. 8 is a table showing the results of the number of failed samples in Example 2.

DESCRIPTION OF EMBODIMENTS

Hereinafter, embodiments of the present invention will be described with reference to the accompanying drawings. In the accompanying drawings, elements that have the same function may be represented by the same reference number. Although the accompanying drawings show specific embodiments and implementations in accordance with the principle of the present invention, they are illustrative only for understanding of the present invention and thus should not be used to narrowly construe the present invention.

Although this embodiment contains fully detailed descriptions for one of ordinary skill in the art to carry out the present invention, it should be appreciated that other implementations and embodiments are also possible and thus that any changes to the configurations or structures as well as replacement of a variety of elements are possible within the spirit and scope of the present invention. Thus, the present invention should not be limited to the following description.

<Configuration of Semiconductor Device>

Figure 5:
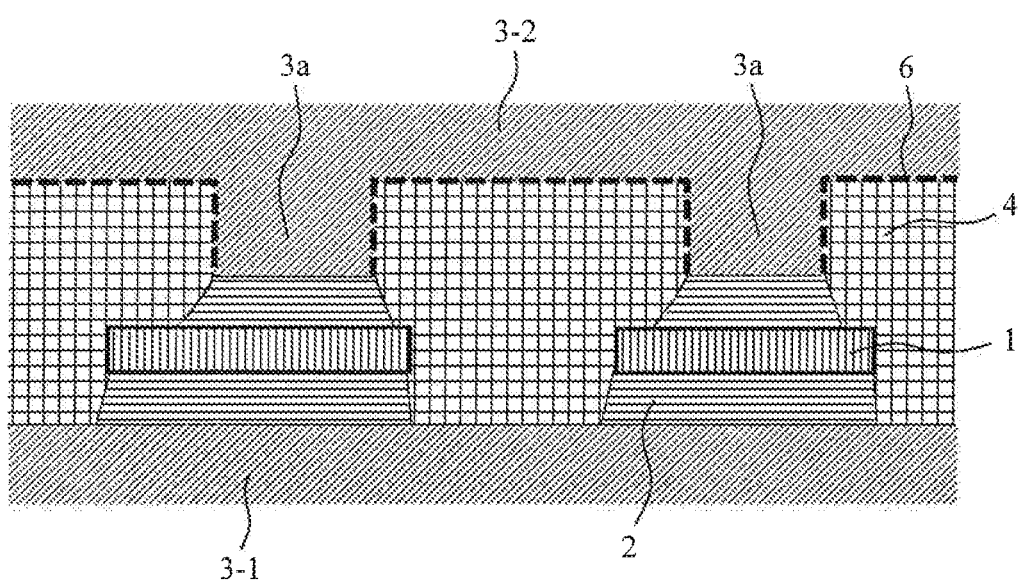
FIG. 5 is a schematic view showing the basic structure of a semiconductor device in accordance with an embodiment of the present invention.

FIG. 5 is a view showing the structure of a semiconductor device in accordance with an embodiment of the present invention.

For the semiconductor device in accordance with this embodiment, a structure is adopted in which lead frames 3-1 and 3-2 and a chip 1 are connected with solder 2. In the semiconductor device, a space formed between the chip 1, which is a semiconductor element, and the lead frames 3-1 and 3-2 is filled with molding resin.

Figure 1:
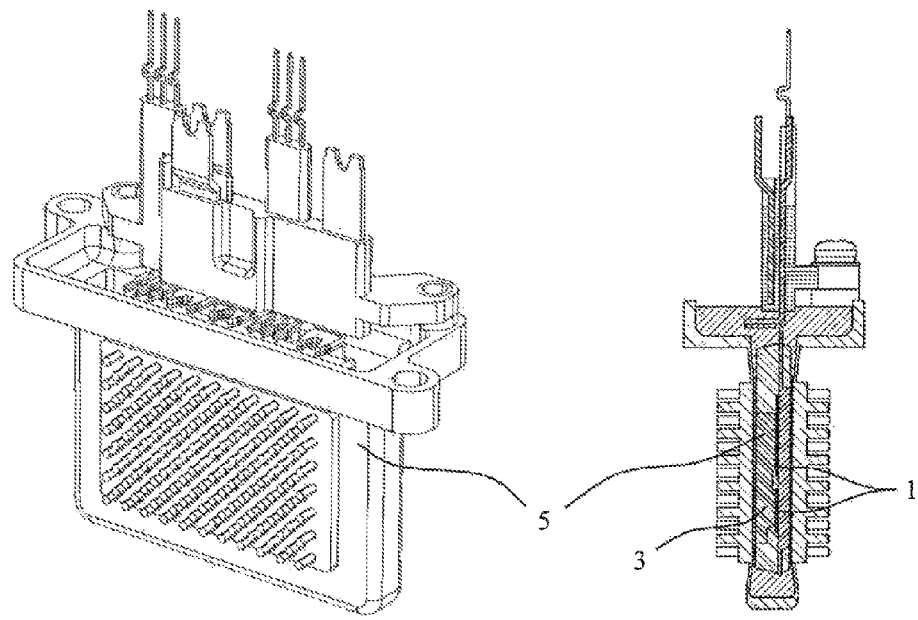
FIG. 1 is a view showing an exemplary module that adopts a method of cooling a chip from the opposite sides thereof.
Figure 2:
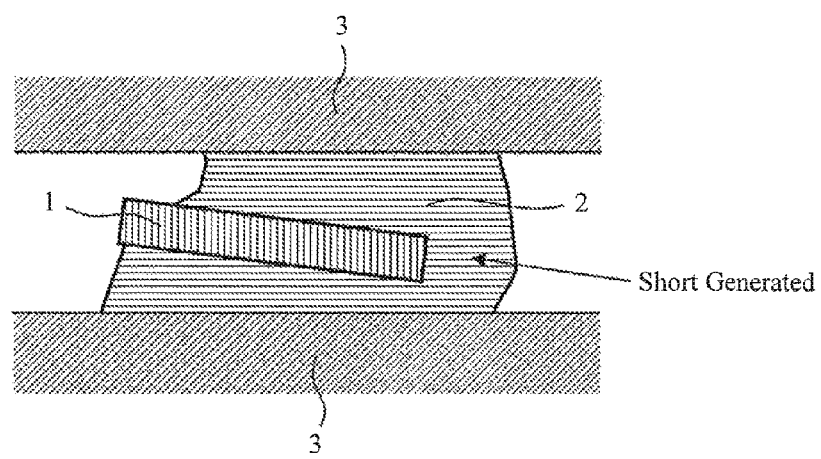
FIG. 2 is a schematic view of an example in which flat lead frames are used and a short is generated due to solder.
Figure 3:
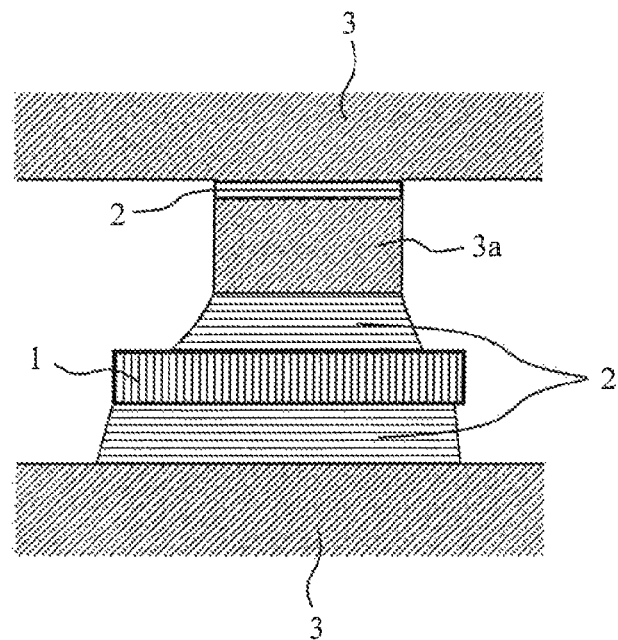
FIG. 3 is a schematic view showing an exemplary structure of a solder connection portion when a base is bonded to one of lead frames.
Figure 4:
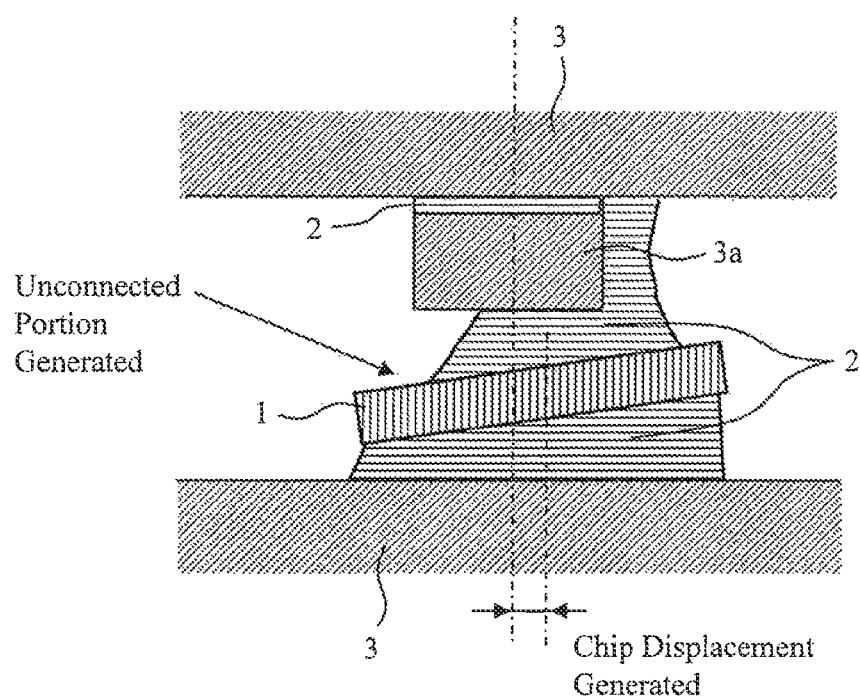
FIG. 4 is a schematic view in which a side surface of a base portion becomes wet with solder during solder connection.

As shown in FIG. 5, the lead frame 3-2 has a base portion (i.e., projecting portion) 3a integrally formed therewith. As described above, in this embodiment, the base portion 3a is integrally formed with the lead frame 3-2 unlike the lead frame and the base portion disclosed in Patent Literature 3 (see FIG. 3). Thus, the production process of the semiconductor device can be simplified more.

In the semiconductor device, a surface 6 other than a solder joint surface of the lead frame 3-2 is subjected to a roughening treatment to allow the surface 6 to become less easily wet with the solder 2. In addition, a region other than a portion, which is to be joined to the solder 2, of the lead frame 3-1 may also be subjected to a roughening treatment. Such a roughening treatment can provide a region where the wettability with the solder 2 is low, and thus can control the degree of adhesion of the solder 2 to a member to which the solder 2 is joined.

It should be noted that a portion, which is to be joined to the solder 2, of the base portion 3a is not subjected to a roughening treatment, or is subjected to a roughening treatment such that it has a lower degree of roughness than portions other than the base portion 3a, Accordingly, the portion, which is to be connected to the solder for connection to the semiconductor element, of the base portion is not roughened or has a low degree of roughness, and thus has high solder wettability. In addition, it is also possible to prevent the side surfaces of the base portion from becoming wet with solder, which would otherwise cause connection failures of the solder or chip displacement, and also prevent peeling of molding resin, which would otherwise break the chip.

It should be noted that when a roughening treatment for the surface of a region, which has no base portion 3a, of the lead frame 3-2 and a roughening treatment for the side surfaces of the base portion 3a are performed with about the same degree of roughening, an advantageous effect can be provided in that the degree of adhesion with a good balance can be achieved when molding resin is injected. However, it is also possible to apply a roughening treatment only to the side surfaces of the base portion 3a and not to the surface of the lead frame 3-2.

<Roughening Treatment>

Herein, a roughening treatment to be applied onto the lead frame will be described. Irregularities that are produced by a roughening treatment are desirably about several μm from a demand for controlling the solder wettability and increasing the degree of adhesion of molding resin.

The roughening treatment is preferably a treatment that chemically forms irregularities on a surface like etching. However, it is also possible to use a treatment that physically forms irregularities on a surface like sandblasting. Further, regarding a roughening treatment that chemically forms irregularities, it is possible to use a blackening reduction treatment or etching that uses a pitting mask other than etching that simply uses acids.

The roughening treatment is applied to, for the lead frame 3-2 with the base portion 3a, the side surfaces of the base portion 3a and the main body of the lead frame 3-2. In order to further increase the reliability, a roughening treatment may also be applied to the other lead frame 3-1 without the base portion 3a.

As described above, the lead frame 3-2 is partially roughened such that a portion, which comes into contact with the molding resin 4, is roughened while a surface, which is to be connected to the solder 2, is not roughened. For a process of such roughening treatment, it is preferable to use a method of, other than masking the surface to be connected to the solder 2, removing the surface to be connected to the solder 2 through machining, such as polishing, after entirely roughening the lead frame 3-2. Alternatively, it is also possible to, for a solder connection surface, which has been entirely roughened, of the lead frame, connect the solder to the lead frame side in advance prior to connection to the chip.

<Regarding Solder>

For the solder 2, it is necessary to carefully select solder materials, connection method, and connection conditions taking into consideration the specifications of the chip 1 and the lead frames 3-1 and 3-2.

(i) Solder Materials

Regarding the solder materials, typical Sn-based solder is preferably used. In order to increase the wettability, Sn—Ag-based solder may also be used. When there is concern about a loss of the Ni-metallized surface of the chip, Sn—Cu-based solder may also be used.

(ii) Solder Connection Method

Regarding the solder connection method, it is desirable to perform, of the conventional die bonding process, supplying a solder sheet or a solder wire or directly supplying molten solder, for example. It is also possible to add a method of placing anchors on the chip 1 or on the lead frames 3-1 and 3-2 or performing scrubbing when supplying the chip 1 and the lead frames 3-1 and 3-2, for example.

Figure 6:
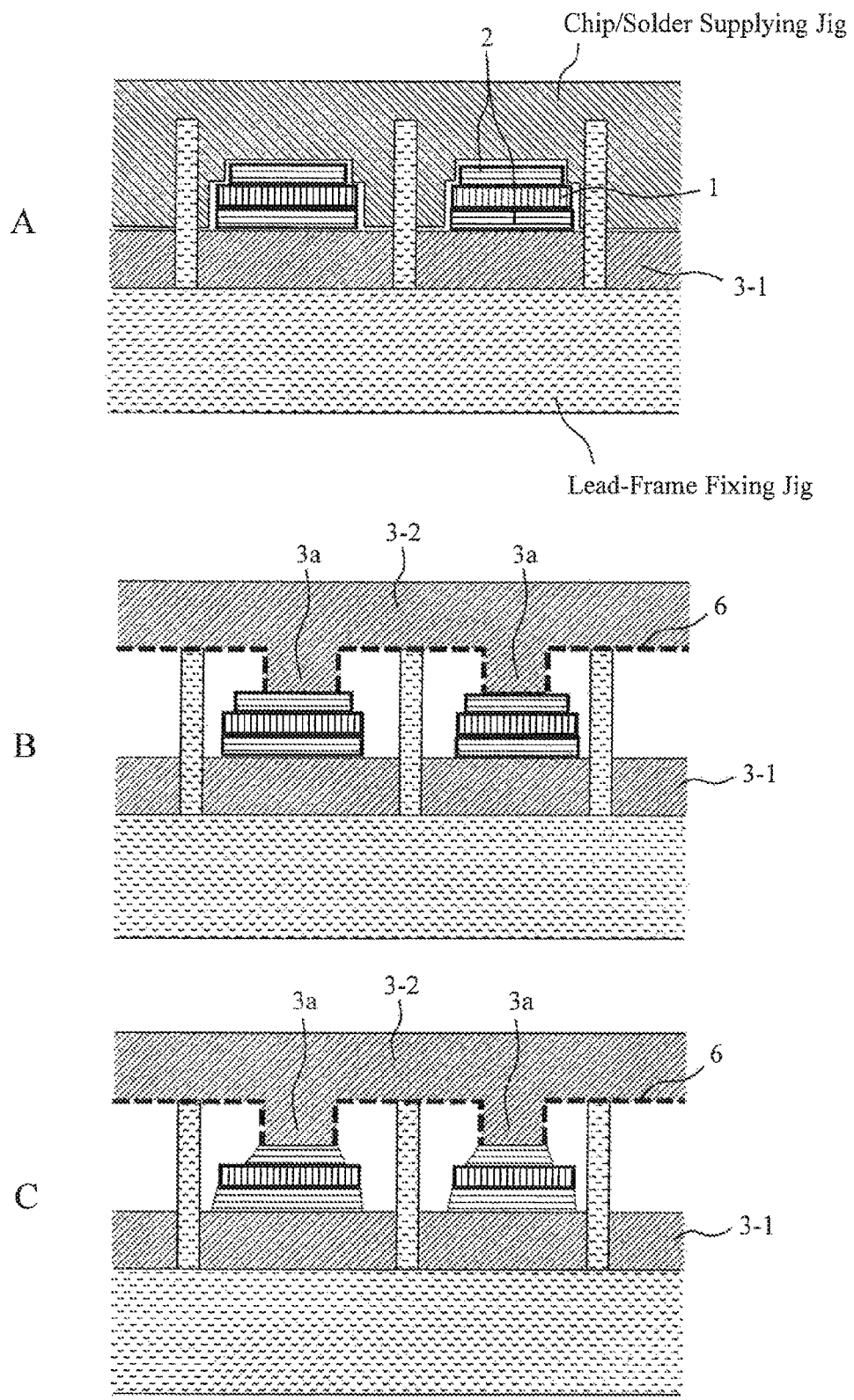
FIG. 6A-6C are views illustrating a solder connection process.

A solder connection process (i.e., reflow connection process) will be described more specifically with reference to FIG. 6. Herein, a vacuum reflow soldering device is used for reflow soldering.

First, the lead frame 3-1 is fixed by a lead-frame fixing jig, and the chip I and the solder 2 are overlaid on the lead frame 3-1. Then, the chip 1 and the solder 2 are fixed by a chip/solder supplying jig (see FIG. 6A).

A roughening treatment is applied in advance to the surface of the lead frame 3-2 (i.e., other than the solder bonding surface of the base portion 3a) through a different step from that in FIG. 6A (not shown).

Next, after the chip 1 and the solder 2 are positioned, the chip/solder supplying jig is removed so that the chip 1 and the solder 2 will not be displaced. Then, the lead frame 3-2, which has been subjected to the roughening treatment, is supplied above the chip I and the solder 2 so as to be connected to the reflow (see FIG. 6B).

During the reflow process, the atmosphere is set to a hydrogen reduction atmosphere, and the atmosphere is replaced before and after heating. After the atmosphere is replaced with an $H_2$ reduction atmosphere, the temperature starts to be increased, and connection is carried out using a temperature profile with a peak of 250° C. After the temperature has reached the peak temperature, vacuum degassing is carried out to remove voids in the solder. As the solder 2 melts and surface tension acts by the reflow, the shape of the solder 2 portion is changed in FIG. 6C. After the solder 2 is cooled, the atmosphere is replaced and the reflow connection process is terminated (see FIG. 6C).

Finally, the space between the lead frame 3-1 and the lead frame 3-2 is filled with molding resin (not shown).

(iii) Connection Conditions

Regarding the connection conditions, the temperature may be selected from the range between the melting point of solder to be adopted and about 350° C. In order to increase the wettability, a temperature on the high-temperature side is preferably selected, while when there is a concern about a loss of the Ni-metallized surface of the chip 1, a temperature on the low temperature side is preferably selected. The atmosphere during connection is desirably a $N_2$ atmosphere rather than the air. Further, in order to increase the wettability, the atmosphere should be set to a reduction atmosphere such as $H_2$ or formic acid.

<Advantageous Effects of Embodiment>

According to the aforementioned structure of the semiconductor device of the present invention, the base portion is integrally formed with the lead frame 3-2 (i.e., second lead frame) (which does not mean that separate components are connected with solder or the like), and the side surfaces of the base portion and the surface of a portion, which comes into contact with molding resin, of the main body of the lead frame are roughened. Therefore, it is possible to prevent wetting with the solder, which would otherwise cause connection failures of the solder or chip displacement. In addition, it is also possible to increase the degree of adhesion between molding resin, which is used for sealing later, and the lead frames, and thus prevent peeling of the molding resin, which would otherwise break the chip or shorten the life of the solder connection portion. Accordingly, it is possible to reduce failures that may occur during solder connection and obtain a highly reliable power module.

EXAMPLES

Example 1

Example 1 of the present invention is described below. Herein, a Cu lead frame with a base portion integrally formed therewith was used as a sample. Two types of lead frames were used: a lead frame with a solid Cu surface without roughness, and a lead frame obtained by partially roughening the side surfaces of a base portion as well as the main body of the lead frame.

The partial roughness of the lead frame was formed by once roughening the entire lead frame, and then removing the roughness of the solder connection surface of the base portion through polishing. For the solder, sheet-shaped Sn3Ag0.5Cu solder was used. For the reflow, a vacuum reflow soldering device was used, and connection was carried out using a temperature profile with a peak of 250° C.

Solder connection was performed on 20 samples, and the presence or absence of wetting with the solder, connection failures of the solder, and generation of chip displacement was confirmed.

FIG. 7 shows the results. As can be seen from FIG. 7, when lead frames without a roughening treatment applied thereto were used, the aforementioned failures were generated, while when lead frames with a roughening treatment applied thereto were used, no failure was generated.

After that, resin molding was performed on each lead frame connected to the chip. After that, a temperature cycle test was performed. Regarding the lead frames without roughness, peeling of resin was generated in all samples, and chip cracking was generated in 5 samples out of 20 samples.

Meanwhile, regarding the lead frames with partial roughness, chip cracking was not generated in any sample. Further, regarding the fatigue life of solder, the lead frames with partial roughness have smaller developing crack portions than the lead frames without roughness, and thus have longer lives.

Example 2

Example 2 of the present invention is described below. As in Example 1, a Cu lead frame with a base portion integrally formed therewith was used as a sample. As in Example 1, two types of lead frames were used: a lead frame obtained by roughening the side surfaces of a base portion as well as the main body of the lead frame, and a lead frame with a solid Cu surface without roughness. The partial roughness of the lead frame was formed by masking a solder connection surface and then immersing the lead frame in acids and thereafter peeling the mask. For the solder, sheet-shaped Sn3AgO.5Cu solder was used. For the reflow, a vacuum reflow soldering device was used, and connection was carried out using a temperature profile with a peak of 250° C.

Solder connection was performed on 20 samples, and the presence or absence of wetting with the solder, connection failures of the solder, and generation of chip displacement was confirmed.

FIG. 8 shows the results. When the lead frames without a roughening treatment applied thereto were used, the aforementioned failures were generated, while when the lead frames with a roughening treatment applied thereto were used, no failure was generated.

After that, resin molding was performed on each lead frame connected to the chip. After that, a temperature cycle test was performed. Regarding the lead frames without roughness, peeling of resin was generated in all samples, and chip cracking was generated in 7 samples out of 20 samples. Meanwhile, regarding the lead frames with partial roughness, chip cracking was not generated in any sample. Further, regarding the fatigue life of solder, the lead frames with partial roughness have smaller developing crack portions than the lead frames without roughness, and thus have longer lives.

INDUSTRIAL APPLICABILITY

In the future advanced information society, there will be a high demand for electric energy. There will also be a demand for power saving associated with environmental problems, and all-electric homes by reducing fossil fuels with a view to reduce $CO_2$ emissions. From such circumstances, the role of power electronics for using power with high efficiency is considered to become more and more important.

In the field of power electronics, there is a strong demand for size reduction of modules as well as an increase in the heat dissipation amount in order to use power with high efficiency. Thus, such possibility should be studied.

The present invention is considered to be effective for alb modules that are obtained by connecting the opposite sides of a chip with solder.

REFERENCE SIGNS LIST

1 Chip
2 Solder
3 Lea frame
3a Lead base portion (base portion)
4 Molding resin
5 CAN-state cooling fins
6 Portion subjected to roughening treatment

The invention claimed is:

1. A semiconductor device comprising:
   a semiconductor element;
   a first lead frame connected to a main surface of the semiconductor element with a solder; and
   a second lead frame connected to an opposite surface of the semiconductor element with a solder, wherein
   a space between the first lead frame and the second lead frame is filled with a molding resin,
   the second lead frame has a main portion and a base portion, the base portion being integrally formed with the main portion, projecting from the main portion toward the semiconductor element, and serving as a portion to be connected to the semiconductor element,
   a surface roughness of side walls of the base portion is higher than a surface roughness of a surface of the base portion that comes into contact with the solder for connection to the semiconductor element, and
   the surface roughness of the side walls is higher than a surface roughness of a surface of the main portion of the second lead frame that is connected to the molding resin.

2. The semiconductor device according to claim 1, wherein the surface of the base portion that comes into contact with the solder for connection to the semiconductor element is made of the same material as the side walls of the base portion.

3. The semiconductor device according to claim 1, wherein the side walls of the base portion of the second lead frame is subjected to a roughening treatment.

* * * * *